(12) United States Patent
Voo

(10) Patent No.: US 7,583,144 B1
(45) Date of Patent: Sep. 1, 2009

(54) POWER EFFICIENT PROGRAMMABLE AMPLIFIER

(75) Inventor: Thart Fah Voo, Singapore (SG)

(73) Assignee: Marvell International Ltd., Hamilton (BM)

( * ) Notice: Subject to any disclaimer, the term of this patent is extended or adjusted under 35 U.S.C. 154(b) by 57 days.

(21) Appl. No.: 11/755,565

(22) Filed: May 30, 2007

Related U.S. Application Data

(60) Provisional application No. 60/830,629, filed on Jul. 13, 2006, provisional application No. 60/831,759, filed on Jul. 19, 2006.

(51) Int. Cl.
*H03F 3/45* (2006.01)
(52) U.S. Cl. ...................................... 330/254; 330/253
(58) Field of Classification Search .................. 330/51, 330/253, 254; 327/359, 563
See application file for complete search history.

(56) References Cited

U.S. PATENT DOCUMENTS

| 6,331,803 | B1 | 12/2001 | Zheng et al. | |
|---|---|---|---|---|
| 6,515,518 | B1* | 2/2003 | Minegishi | 330/254 |
| 7,292,101 | B2* | 11/2007 | Kocaman et al. | 330/254 |

* cited by examiner

*Primary Examiner*—Khanh V Nguyen

(57) ABSTRACT

A power efficient programmable gain amplifier is disclosed that provides programmable power consumption. The amplifier may include a first gain circuit and a programmable circuit that may include one or more second gain circuits that are programmable to provide variable power consumption and gain. The second gain circuits may be associated with one or more second current sources which may be programmably controlled to be turned on or off. When turned off, the second current source also may reduce the current value to substantially zero, thus reducing an overall power consumption of the amplifier.

45 Claims, 13 Drawing Sheets

US 7,583,144 B1

POWER EFFICIENT PROGRAMMABLE AMPLIFIER

INCORPORATION BY REFERENCE

This application claims priority under 35 U.S.C. § 119(e) from U.S. Provisional Application Ser. No. 60/830,629 filed on Jul. 13, 2006 and U.S. Provisional Application Ser. No. 60/931,759 filed on Jul. 19, 2006, both incorporated by reference herein in their entirety.

BACKGROUND

Analog amplifiers are incorporated into a vast number of devices used in everyday life. For example, analog amplifiers are used in automobile engines, cellular telephones, magnetic hard disk drives, fiber optic communication systems and even children's toys.

Unfortunately, analog amplifiers often suffer from a number of performance shortfalls. For example, analog amplifiers are subject to a trade-off between available voltage gain and frequency bandwidth. This trade-off, often referred to as the amplifier's "gain-bandwidth product", may remain nearly constant over the operating range of the amplifier.

Additionally, the proliferation of hand-held devices, such as cellular phones and personal digital assistants (PDAs), has added another demand in that analog amplifiers must be increasingly energy efficient. Unfortunately, the gain-bandwidth product of an analog amplifier is often dependent on the current it consumes. Thus, every decrease in current consumption may reduce the amplifier's gain-bandwidth product. Accordingly, it should be appreciated that even modest current savings may cause a particular amplifier to attenuate high-frequency signal components to the detriment of the system incorporating the amplifier.

SUMMARY

A power efficient programmable gain amplifier ("amplifier") is disclosed that provides programmable power consumption. The amplifier may include a first gain circuit and a programmable circuit that may include one or more second gain circuits that are programmable to provide variable power consumption and gain. The first gain circuit may be associated with a first current source and each of the second gain circuits may be associated with a second current source. The second current source may be programmably controlled to be turned on or off so that a gain provided by a second gain circuit may be selectively added to a gain provided to the first gain circuit. When turned off, the second current source also may reduce the current value to substantially zero, thus reducing an overall power consumption of the amplifier.

The first gain circuit may include an upper portion and a lower portion. The lower portion may be connected to the first current source and the upper portion may be coupled to one or more current sources. The current sources may also be programmable and are turned on or off with the second current sources in a coordinated manner so that an increase or decrease of current of all the second current sources may be balanced by a corresponding increase or decrease of current supplied by the current sources.

The amplifier may also include a cascade circuit coupled to the upper portion of the first gain circuit. The current sources may be divided into a first portion and a second portion. The first portion of the current sources may be connected to the first portion of the cascade circuit and the second portion may be connected to the second portion of the cascade circuit. Different ones of the first and second portions of the current sources may be activated to maintain a performance such as gain-bandwidth product of the cascade circuit.

The amplifier may include a third gain circuit having third current sources. The third gain circuit may be programmable by shunting a gain portion instead of turning off the associated third current source so that a current flow through the cascade circuit may be maintained for maintaining performance.

BRIEF DESCRIPTION OF THE DRAWINGS

The power efficient programmable gain amplifier is described with reference to the following figures, wherein like numerals reference like elements, and wherein.

DETAILED DESCRIPTION OF EMBODIMENTS

In the following descriptions, many of the exemplary circuits are shown to include n-channel metal-oxide-semiconductor field-effect transistors (MOSFETs) in a variety of configurations. While MOSFET devices are used by example, the disclosed circuits may be implemented using any number of other transistor types, such as J-FETs, bipolar transistors and so on. Additionally, while n-channel devices are used in the following examples, the same general approaches may also apply to circuits incorporating p-channel FETs or PNP bipolar transistors, for example.

Still further, while the terms "drain" and "source" are used for ease of explanation and to adhere to traditional engineering usage, it should be recognized that a drain and source of a FET transistor may be considered interchangeable, and for the following descriptions merely thought of as a first end and a second end of a semiconductor channel unless otherwise stated or apparent to one of ordinary skill in the art.

Figure 1:
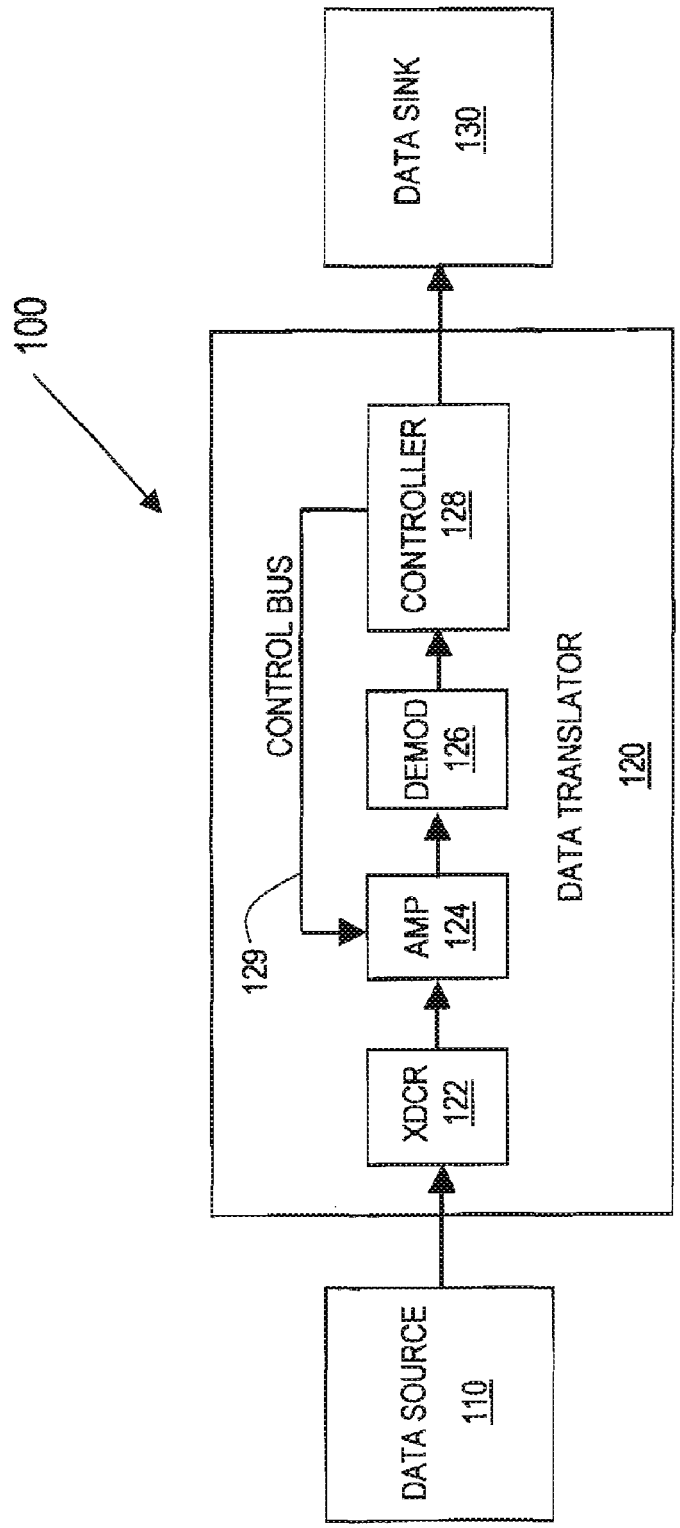
FIG. 1 is a block diagram of an exemplary data manipulation system that includes a programmable amplifier.

FIG. 1 is a block diagram of an exemplary data manipulation system 100. As shown in FIG. 1, data manipulation system 100 includes a data source 110, a data translator 120 and a data sink 130. As is also shown in FIG. 1, data translator 120 includes a transducer 122, a programmable amplifier 124, a demodulator 126 and a controller 128.

In operation, a data signal may be provided by data source 110 to the data translator's transducer 122. Transducer 122, in turn, may change the data signal from a first form, e.g., a magnetic field or modulated light signal, to an output signal having an electrical form. The output electrical signal may then be fed to programmable amplifier 124. Programmable amplifier 124 may receive the electrical signal produced by transducer 122, amplify the electrical signal, and provide the resultant amplified electrical signal to demodulator 126. Upon receiving the amplified electrical signal, demodulator 126 may perform any number of processes to convert the amplified signal from analog form to a stream of digital data, which then may be forwarded to controller 128.

As controller 128 receives the stream of digital data from demodulator 126, controller 128 may both forward the digital data to the data sink 130 and perform any number of analyses on the digital data. For example, controller 128 may look for characteristic errors that may indicate that demodulator 126 is receiving excessively attenuated or amplified signals, or perhaps signals that have undergone excess distortion due to bandwidth limitations of programmable amplifier 124. Alternatively, demodulator 126 may perform such an analysis on the amplified electrical signal provided by programmable amplifier 124 and forward the analysis results to controller 128.

After an appropriate analysis is performed, controller 128 may send any number of control signals to programmable amplifier 124 via control bus 129. The various control signals sent via control bus 129 may include control information instructing the programmable amplifier 124 to change its gain level. Additionally, the control signals sent via control bus 129 may include control information instructing programmable amplifier 124 to change its power consumption in a manner that might either advantageously increase the amplifier's gain-bandwidth product or decrease the amplifier's gain-bandwidth product, but not to an appreciably detrimental level. For example, if the upper frequency limit of an input signal is 1.2 GHz and a power-saving command would only affect the gain-bandwidth product of programmable amplifier 124 such that only frequencies above 1.5 GHz would be substantially affected, then the power-saving command could be implemented by programmable amplifier 124 without any detrimental effects.

Upon receiving the control signals, programmable amplifier 124 may make the appropriate internal changes to adjust its gain and/or its power consumption. Subsequently, any adjusted amplified output signal may be fed to demodulator 126 and controller 128 for further demodulation and analysis.

In various embodiments, data source 110 may be any number of known or later developed data communication systems or data storage systems. For example, data source 110 may be a fiber-optic communication system, a wireless transmitter, an electrical transmission system (e.g., an Ethernet LAN), an optical storage medium, a magnetic hard disk drive, an electronic memory and so on. Similarly, data sink 130 may be any number of known or later developed data communications or storage systems capable of receiving signals produced by data translator 120. Depending on the nature of data source 110, transducer 122 may be any number of known or later developed transducer systems, such as a magnetic head reader for a hard disk drive, an optical-to-electrical transducer, a transimpedance amplifier, a voltage buffer, an antenna for use with a wireless communication system and the like. Given the wide variety of environmental circumstances that translator 120 may endure, as well as the manufacturing process variations that may occur in data source 110 or transducer 122, the gain and/or gain-frequency product of programmable amplifier 124 may need to be adjusted as will be further discussed below.

Figure 2:
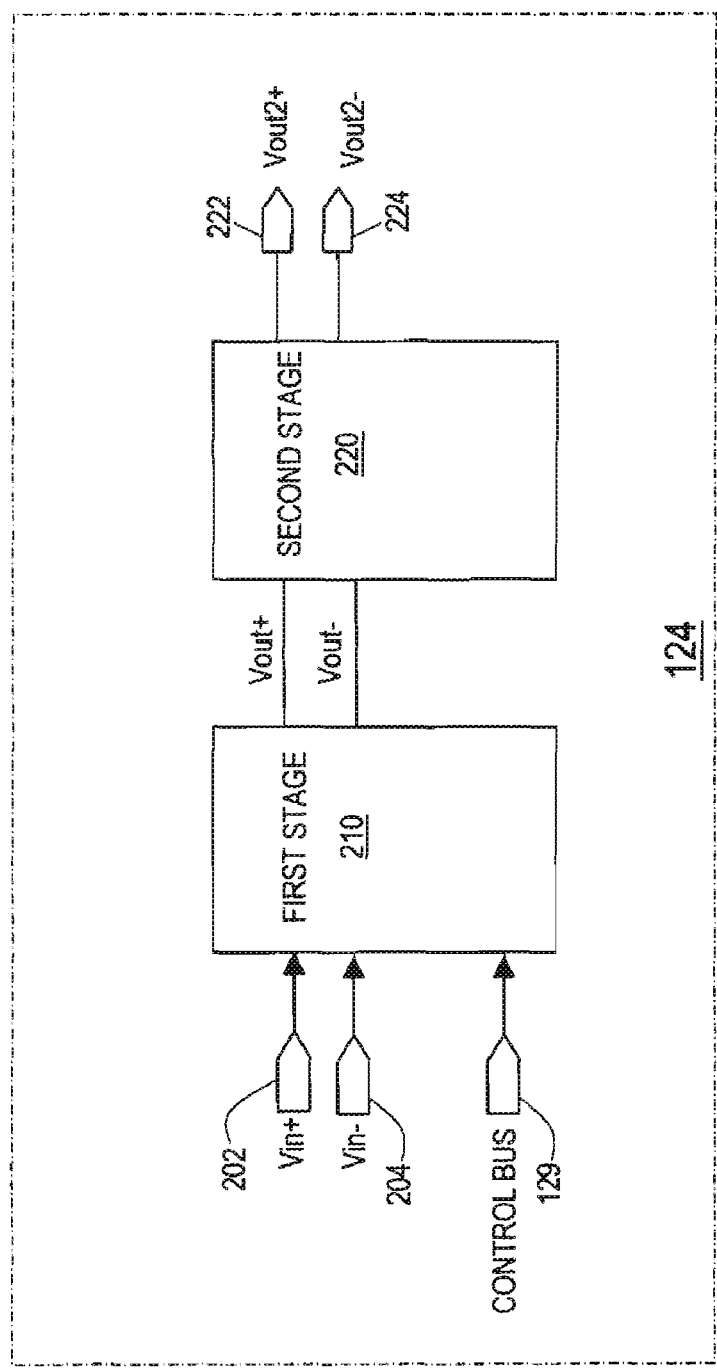
FIG. 2 is a block diagram of a portion of an exemplary amplifier that may be used in the data manipulation system of FIG. 1.

FIG. 2 depicts a portion of the programmable amplifier 124 of FIG. 1. As shown in FIG. 2, programmable amplifier 124 includes a first amplifier stage 210 and an optional second amplifier stage 220. In operation, first amplifier stage 210 may receive any number of commands from control bus 129. Based on the commands provided by control bus 129, first amplifier stage 210 may configure (or reconfigure) its internal circuitry to provide a variety of gain levels as will be further discussed below.

Assuming that programmable amplifier 124 is under power and that first amplifier stage 210 is appropriately configured, a differential electrical signal (Vin+, Vin−) (which may be a single-ended electrical signal with ground) may be provided by a pair of input nodes 202 and 204 to first amplifier stage 210. First amplifier stage 210 may then amplify the received electrical signal. After amplifying the received electrical signal, first amplifier stage 210 may output the amplified signal to (optional) second amplifier stage 220, which may further amplify the electrical signal and provide the further amplified signal (Vout2+, Vout2−) to output nodes 222 and 224.

Figure 3:
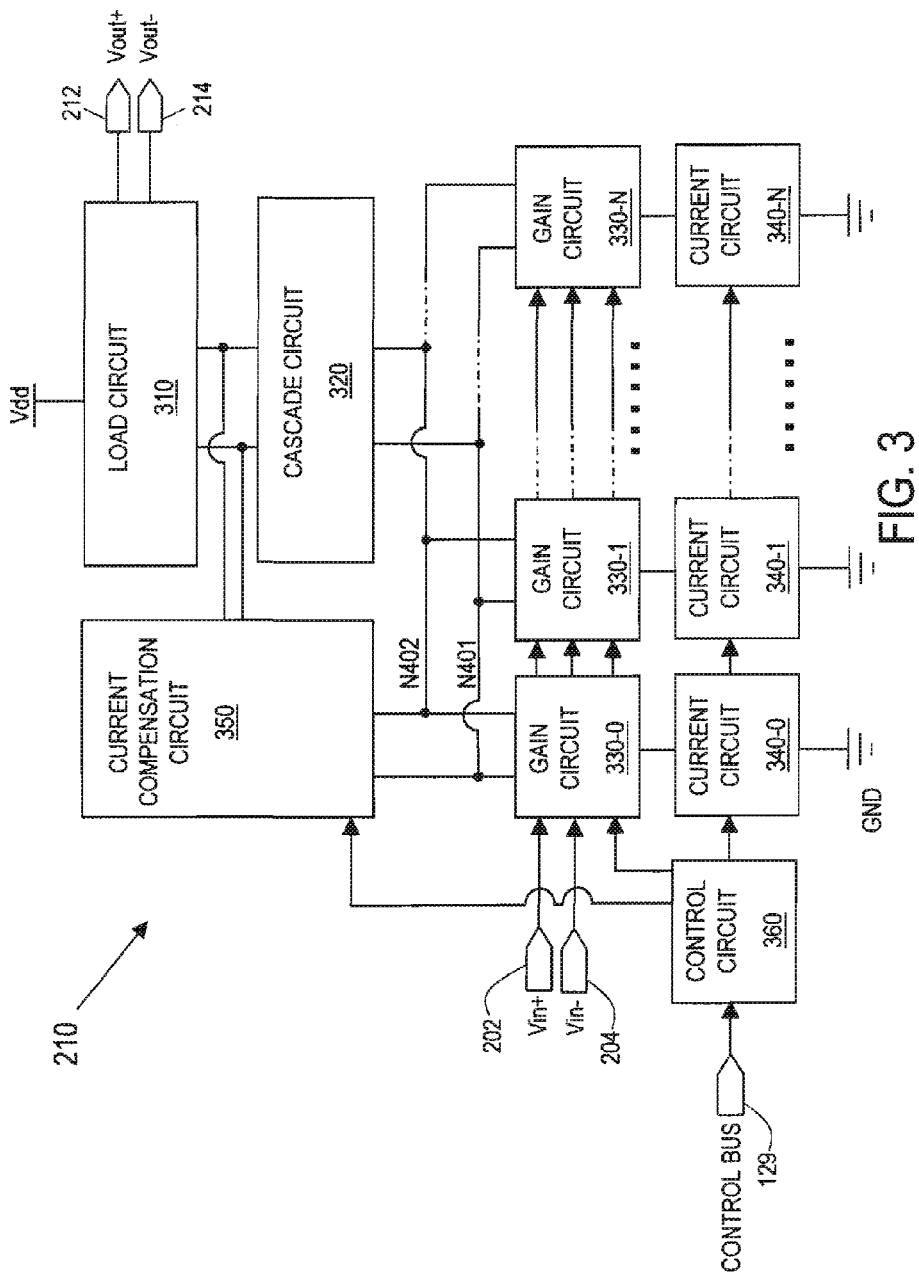
FIG. 3 is a block diagram of an exemplary amplifying stage of the amplifier of FIG. 2.

FIG. 3 is a block diagram of first amplifier stage 210 of FIG. 2. As shown in FIG. 3, first amplifier stage 210 includes a load circuit 310, a cascade circuit 320, a number of gain circuits 330-0 . . . 330-N, a number of current circuits 340-0 . . . 340-N, a current compensation circuit 350 and a control circuit 360. First gain circuit 330-0 and first current circuit 340-0 will be discussed with respect to FIG. 4, the remaining gain circuits 330-1 . . . 330-N and current circuits 340-1 . . . 340-N will be discussed with respect to FIGS. 5 and 8, load circuit 310 and cascade circuit 320 will be discussed with respect to FIG. 6, current compensation circuit 350 will be discussed with respect to FIGS. 9 and 10, and control circuit 360 will be discussed with respect to FIG. 10.

Figure 4:
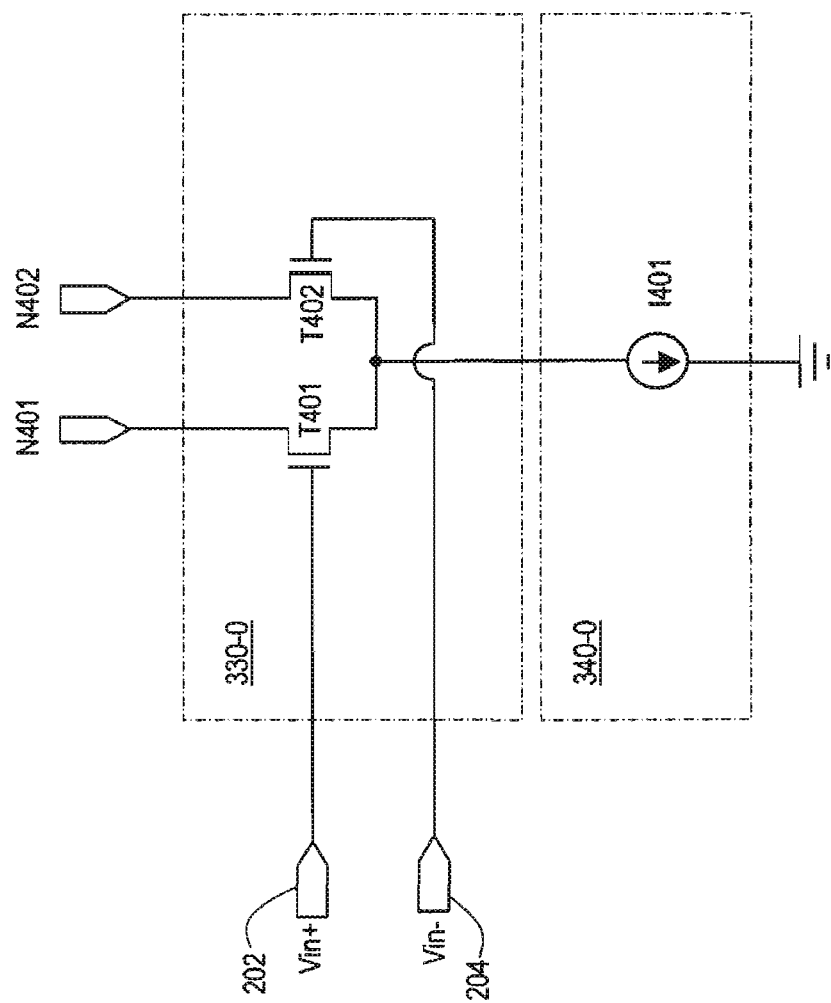
FIG. 4 is a schematic diagram of an exemplary first gain circuit and first current source for use in the amplifying stage of FIG. 3.

Continuing to FIG. 4, a schematic diagram of exemplary first gain circuit 330 is depicted in context with exemplary first current circuit 340-0. As shown in FIG. 4, gain circuit 330-0 includes a first transistor T401 and a second transistor T402, and first current circuit 340-0 includes a current source I401. Note that the sources of transistors T401 and T402 are connected directly to both one another and to current source I401, the gates of transistors T401 and T402 are respectively connected to input nodes 202 and 204, and the drains of transistors T401 and T402 are respectively connected to nodes N401 and N402.

In operation, a differential electrical signal provided by nodes 202 and 204 may be used to drive the gates of transistors T401 and T402. In response, the respective channel conductances of transistors T401 and T402 may change in a manner to provide gain resulting in differential current signals applied to nodes N401 and N402. Note that the strength of the differential current signals may vary according to a number of parameters, such as the amplitude of the differential input signal, the intrinsic characteristics of transistors T401 and T402, and the current level of current source I401. Note that while current source I401 is depicted as an ideal constant current source, in various embodiments current source I401 may take a number of forms, such as a resistor, a current mirror or any other known or later developed circuitry useful as a current source.

Figure 5:
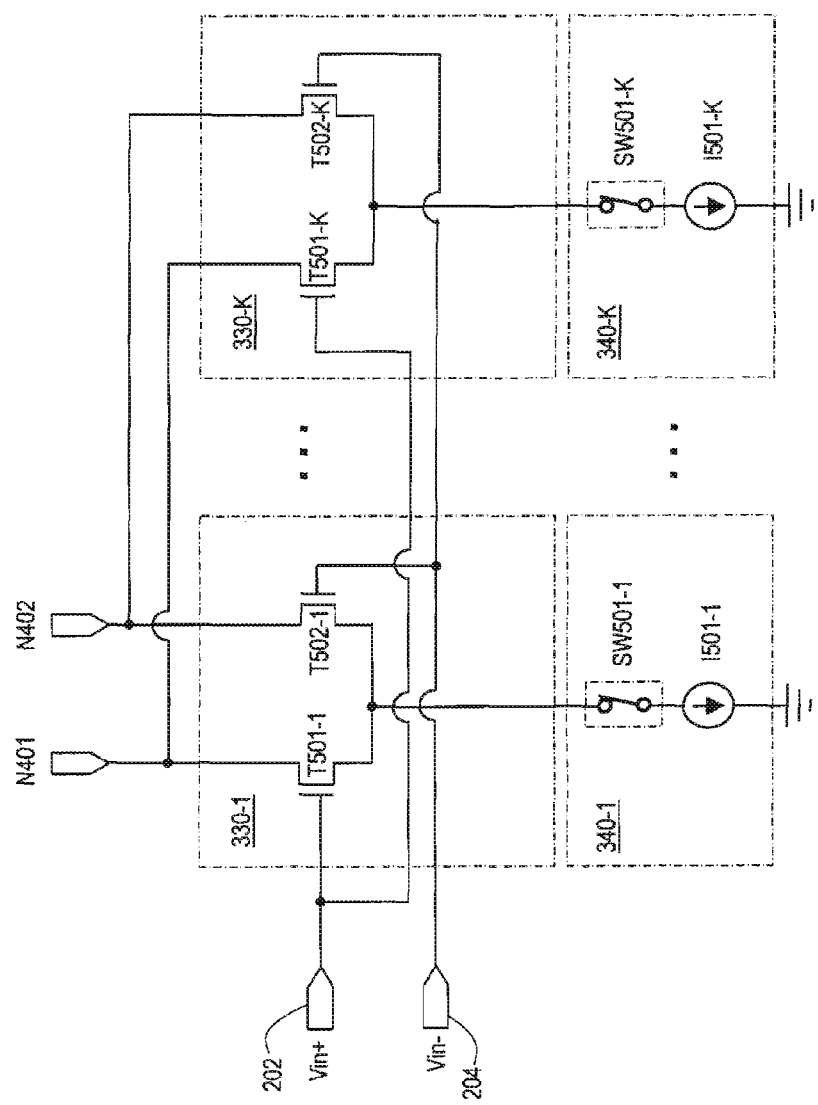
FIG. 5 is a schematic diagram of an exemplary gain circuit with switchable current source for use in the first amplifying stage of FIG. 3.

Continuing to FIG. 5, a schematic diagram of a number of exemplary gain circuits 330-1 . . . 330-K with complementary switchable current circuits 340-1 . . . 340-K is depicted. Each gain circuit 330-1 . . . 330-K includes a pair of transistors T501-1/T502-1 . . . T501-K/T502-K, while each switchable current circuit 340-1 . . . 340-K includes a current source I501-1 . . . I501-K in series with a respective current switch SW501-1 . . . SW501-K.

In operation, each gain circuit 330-1 . . . 330-K may be enabled or disabled based on the state of its respective switch SW501-1 . . . SW501-K. For example, should switch SW501-1 receive an "on" command from a control bus (not shown), switch SW501-1 may close to enable current to pass from gain circuit 330-1 to ground in a manner determined by current source I501-1. The current may enable gain circuit 330-1 to provide a differential current signal to nodes N401 and N402, which may be respectively connected to the drains of transistors T401 and T402.

Note that the state of each switch SW501-1 . . . SW501-K may not only enable or disable its respective gain circuit 330-1 . . . 330-K, but also cause a change in the amount of current drained from nodes N401 and N402. Accordingly, the opening of each switch SW501-1 . . . SW501-K may represent a current savings to amplifier 124. However, this same current savings may lead to certain complications.

Figure 6:
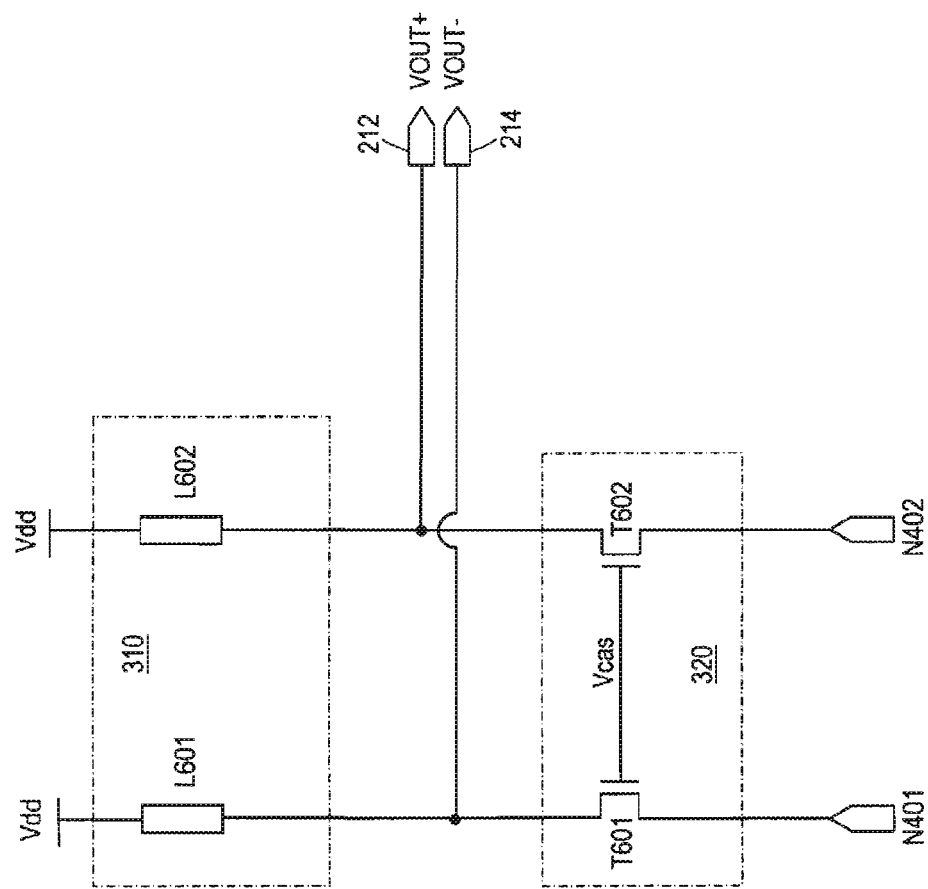
FIG. 6 is a schematic diagram of an exemplary load circuit and cascade circuit for use in the exemplary amplifying stage of FIG. 3.

Continuing to FIG. 6, a schematic diagram of exemplary load circuit 310 is shown in context with exemplary cascade circuit 320. Load circuit 310 includes two loads L601 and L602, while cascade circuit 320 includes a pair of cascade transistors T601 and T602 in series with loads L601 and L602.

In operation, cascade transistors T601 and T602 may be appropriately biased via a cascade biasing node 602. Assuming that cascade transistors T601 and T602 are appropriately biased, the sources of cascade transistors T601 and T602 may receive a combined differential current signal derived from the sum of the individual current drains of gain circuits 330-0 . . . 330-N. Cascade transistors T601 and T602 may pass the combined current drains of the various gain circuits 330-0 . . . 330-N to loads L601 and L602 to provide additional gain to amplifier 124 as well as decouple the parasitic loading inherent in gain circuits 330-0 . . . 330-N from loads L601 and L602. This may allow loads L601 and L602 to better combine the individual current signals of gain circuits 330-0 . . . 330-N to provide a differential output voltage signal (Vout+, Vout−) at nodes 212 and 214. Note that while loads L601 and L602 are depicted as generic components, it should be appreciated that loads L601 and L602 may vary from embodiment to embodiment to include any number of resistors, current mirrors or other controlled current sources as may be found necessary or advantageous.

It should be appreciated that both the gain provided by cascade transistors T601 and T602, as well as the gain-bandwidth product of programmable amplifier 124, may be dependent on the current levels passing through cascade transistors T601 and T602. Accordingly, for every switch SW501-1 . . . SW501-K of FIG. 5 that is turned off, there may be a proportional decrease in current passing through cascade transistors T601 and T602. As a result, the gain of cascade transistors T601 and T602 (which may vary as a function of current) and the gain-bandwidth product of programmable amplifier 124 may decrease. While in certain instances a decrease in gain-bandwidth product may have no appreciable effect upon programmable amplifier 124, in other instances such decreases in current may affect the gain-bandwidth product of amplifier 124 to the detriment of a system employing amplifier 124.

Figure 7:
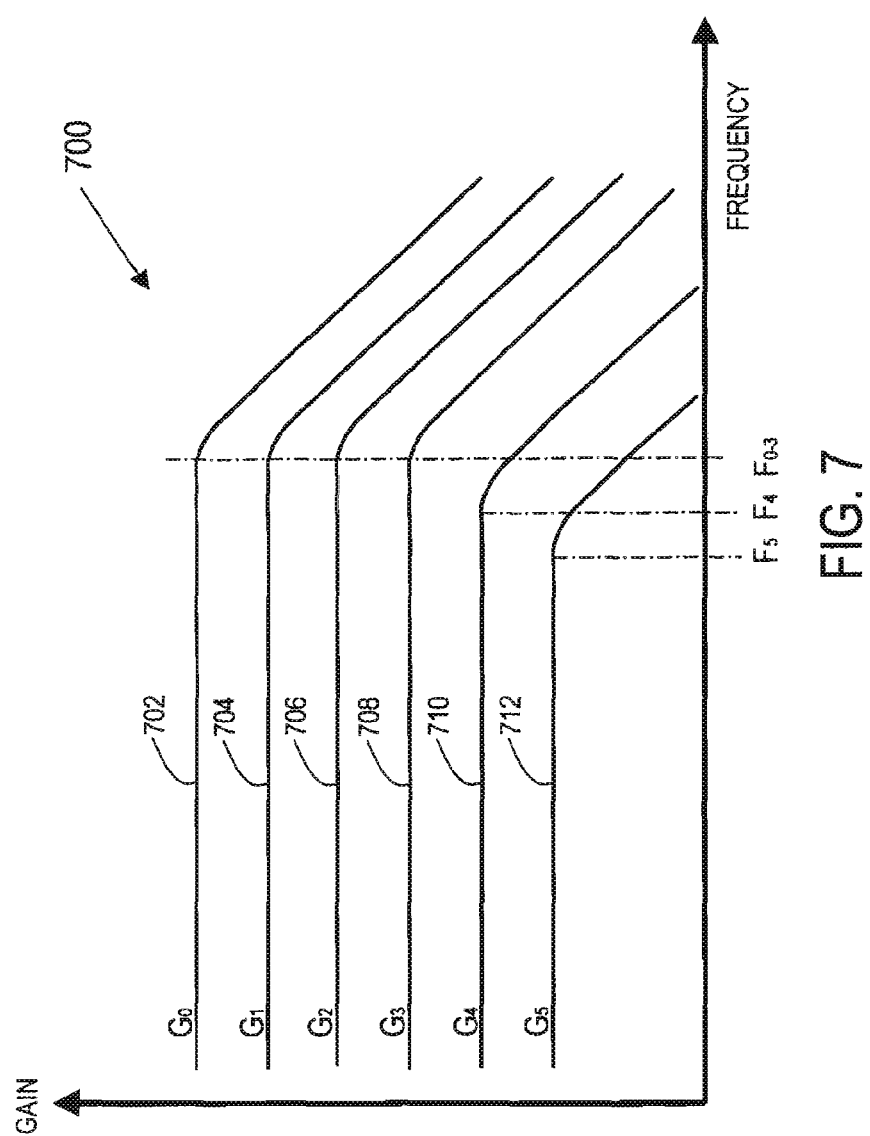
FIG. 7 is a series of exemplary Bode plots for a variety of gain levels for an exemplary embodiment of the amplifying stage of FIG. 3.

For example, FIG. 7 depicts a Bode diagram 700 illustrating an effect of an amplifier's gain-bandwidth product that an incrementally decreasing current passing through cascade transistors T601 and T602 may have. As shown in FIG. 7, six separate Bode plots 702-712 are shown for six respective gain levels $G_0$-$G_5$. Note that for every decrease in gain, there may be a corresponding decrease in available current passing through cascade transistors T601 and T602. For example, for gain level $G_0$ there may be 10 mA of current passing through each of cascade transistors T601 and T602 while for gain level $G_1$ there may be only 9.0 mA. Similarly, for gain level $G_2$ there may be 8.0 mA of current, for gain level $G_3$ there may be 7.0 mA of current, and so on.

As FIG. 7 suggests, it may be possible that different levels of current passing through cascade transistors T601 and T602 to have little or no appreciable effect upon the bandwidth of an amplifier, or that any decreases in an amplifier's gain-bandwidth product is at least partially offset by a lower gain thus preserving bandwidth. For example, as shown in FIG. 7 the bandwidth for gains $G_0$-$G_3$ may be relatively constant (i.e., its "knee" is at frequency $F_{0-3}$) even though the amount of available current passing through the cascade transistors T601 and T602 varies substantially.

However, as is also suggested by FIG. 7, a particular amplifier may eventually suffer a decrease in its gain-bandwidth product as current passing through cascade transistors T601 and T602 decreases beyond a certain threshold. For example, again referring to FIG. 7, the "knee" (frequency $F_4$) of Bode plot 710 (gain levels $G_4$) shows a substantial deterioration in available bandwidth compared to Bode plots 702-708 (gain levels $G_0$-$G_4$), and Bode plot 712 (gain level $G_5$) shows an even greater level of deterioration. While in certain instances this deterioration may be acceptable or inconsequential, in various circumstances such deterioration may be problematic. Accordingly, it may be advantageous to supplement the programmable gain circuitry shown in FIG. 5 with a number of other gain circuits that can change gain without varying the amount of current passing through cascade transistors T601 and T602.

Figure 8:
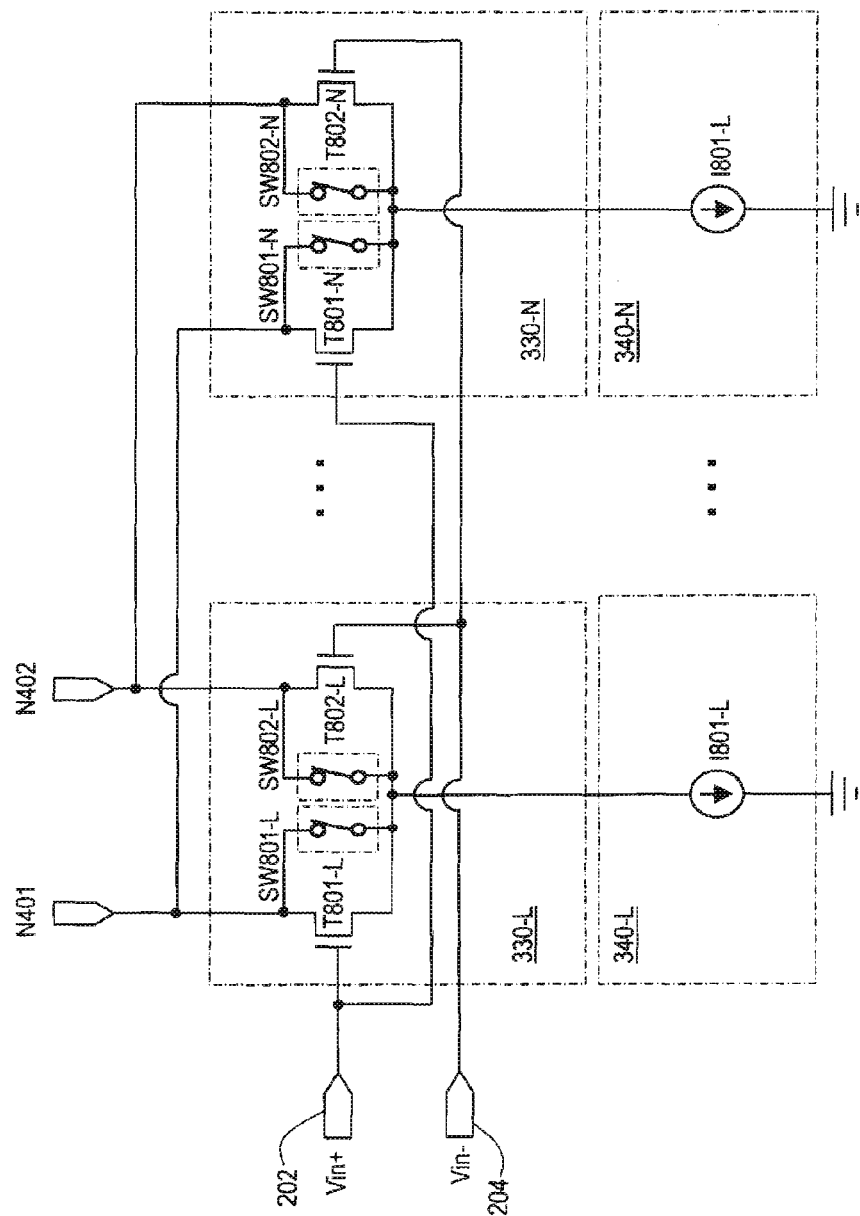
FIG. 8 is a schematic diagram of another exemplary switchable gain circuit with a complementary current circuit for use in the first amplifying stage of FIG. 3.

An example of such supplementary gain circuits is discussed with respect to FIG. 8, which depicts a schematic diagram of another series of non-power-conserving gain circuits 330-L . . . 330-N and complementary current circuits 340-L . . . 340-N. As shown in FIG. 8, the overall configuration of gain circuit 330-L . . . 330-N and current circuits 340-L . . . 340-N is similar to gain circuit 330-1 . . . 330-K and current sources 340-1 . . . 340-K of FIG. 5 except that series switches SW501-1 . . . SW501-K of FIG. 5 are replaced with pairs of "shunting" switches SW801-L/SW802-L . . . SW801-N/SW802-N respectively placed across the drains and sources of transistors T501-L/T502-L . . . T501-N/T502-N.

In operation, each gain circuit 330-L . . . 330-N may be enabled to provide differential current to nodes N401 and N402 when their respective pairs of "shunting" switches SW801-L/SW802-L . . . SW801-N/SW802-N are turned off/opened. However, when a particular pair of shunting switches are closed, the respective gain circuit is disabled without affecting overall current drain. For example, when shunting switches SW801-L and SW802-L are on/closed, the conductive channels of transistors T501-L and T502-L are effectively shorted such that, while a constant current may be provided to both nodes N401 and N402, no differential current (and thus no gain) is provided.

A careful analysis of FIG. 8 reveals that gain circuits 330-L . . . 330-N may have little or no appreciable effect on the total current consumption of amplifier 124. That is, since the total current passing through gain circuits 330-L . . . 330-N may be constant regardless of the states of their respective shunting switches SW801-L . . . SW801-N and SW802-L . . . SW802-N, the resultant current passing through cascade transistors T601 and T602 may not appreciably change as the gain of amplifier 124 is changed. As a result, gain may be changed without appreciably affecting the gain-bandwidth product of programmable amplifier 124. Further examples of switchable gain circuits may be found in U.S. Pat. No. 6,331,803 herein incorporated by reference in its entirety for all purposes, as well as in contemporaneously filed U.S. patent application Ser. No. 11/755,566 entitled "Programmable Gain Amplifier" by inventor Thart Vah VOO (Singapore) also herein incorporated by reference in its entirety for all purposes.

Returning to the Bode plots 702-712 of FIG. 7, it should be appreciated that a combination of the gain circuitry of FIGS. 4, 5 and 8 might be advantageously used for a particular programmable amplifier. For example, by using constant gain circuit 330-0 of FIG. 4, four gain circuits similar to the gain circuits 330-1 . . . 330-K of FIG. 5 and three gain circuits similar to the gain circuits 330-L . . . 330-N of FIG. 8, an amplifier having eight gain levels $G_0$-$G_7$ may be constructed without causing a total current level to decrease below a threshold causing an appreciable decrease in gain-bandwidth product. By allowing the four gain circuits similar to those of FIG. 5 to be the first to turn off and the last to turn on, overall power consumption may be substantially reduced.

In an alternative to the example discussed immediately above, it may also be advantageous to have more than the four current-changing gain circuits even if such a configuration may affect the gain-bandwidth product of an amplifier for some gain levels. For example, by using constant gain circuit 330-0 of FIG. 4, six gain circuits similar to the gain circuits 330-1 . . . 330-K of FIG. 5 and three gain circuits similar to the gain circuits 330-L . . . 330-N of FIG. 8, an amplifier having ten gain levels $G_0$-$G_9$ may be constructed such that eight gain levels $G_0$-$G_7$ may be achieved without compromising the gain-bandwidth product. While the two extra levels of gain $G_8$-$G_9$ gain may be had at the expense of an amplifier's gain-bandwidth product, as long as there is no detrimental effect to the system incorporating the subject amplifier, or if the benefits of current consumption outweigh the detriments to bandwidth, the addition of the extra gain levels may be an overall asset.

While the advantages of combining the various gain circuitry of FIGS. 5 and 8 should now be apparent, an amplifier may also use a number of alternative means for changing gain without requiring the gain circuitry of FIG. 8. Such an alternative means can act as a current compensation measure to keep a minimum current passing through cascade transistors T601 and T602 regardless of the number of current-saving gain circuits 330-1 . . . 330-K used.

Figure 9:
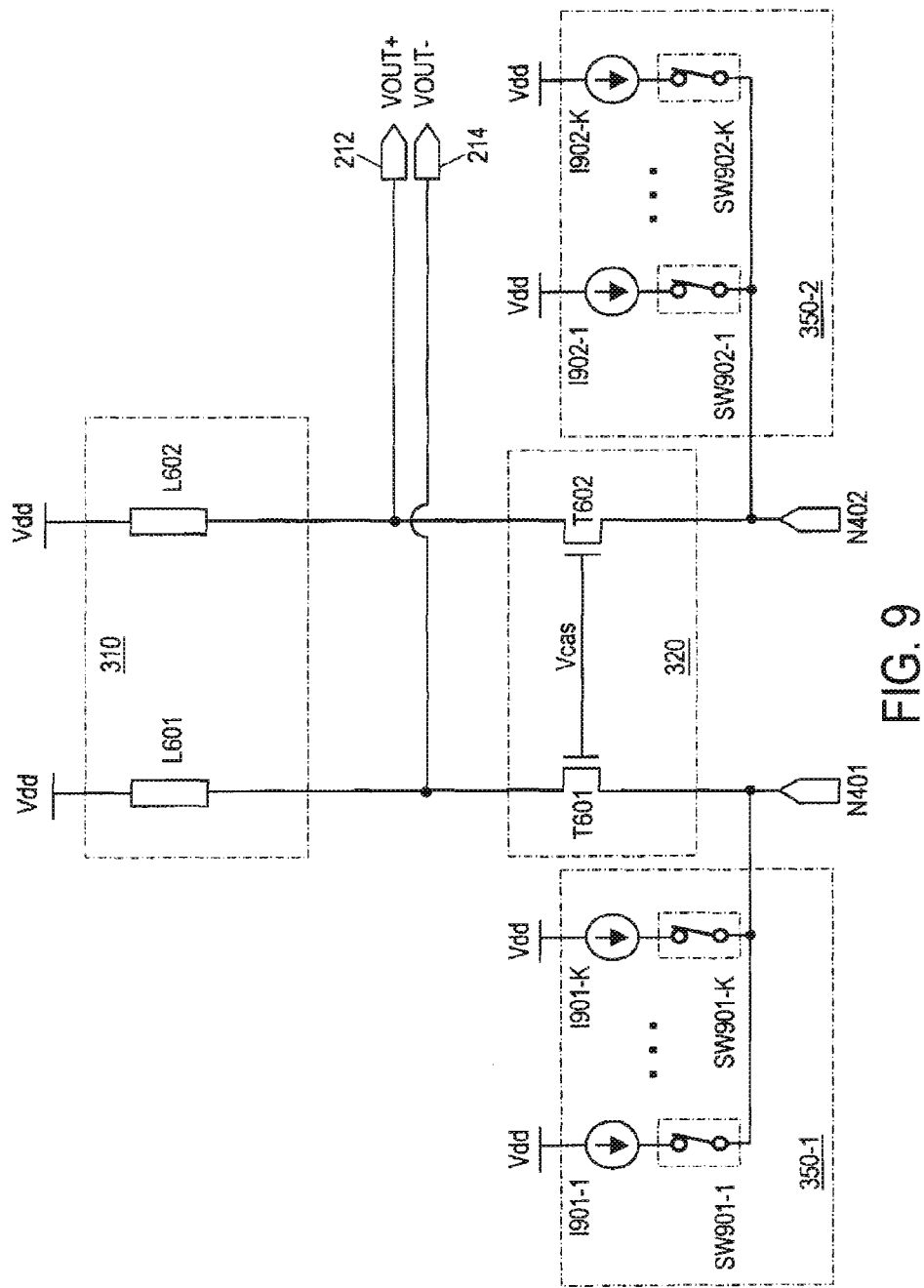
FIG. 9 is a schematic diagram of the load circuit and cascade circuit of FIG. 6 supplemented by an embodiment of various current compensation circuitry.

A first embodiment of this current compensation means is shown in FIG. 9, which depicts the load circuit 310 and cascade circuit 320 of FIG. 6 supplemented by a pair of current compensation circuits 350-1 and 350-2 respectively connected to nodes N401 and N402. As shown in FIG. 9, current compensation circuit 350-1 includes a series of current sources I901-1 . . . I901-K each in series with a respective switch SW901-1 . . . SW901-K, while current compensation circuit 350-2 includes a complementary series of current sources I902-1 . . . I902-K each in series with a respective switch SW902-1 . . . SW902-K.

In operation, current compensation circuits 350-1 and 350-2 can be configured to compensate for any change in current drain caused by the gain and current circuits 330-1 . . . 330-K and 340-1 . . . 340-K of FIG. 5. For example, should switch SW501-1 (FIG. 5) be opened to disable gain circuit 330-1, the decrease in current caused by the disabling of gain circuit 330-1 may be compensated by opening switches SW901-1 and SW902-1. By designing current sources I901-1 and I902-1 such that they (together) provide a comparable current to that of current source I501-1, the change in current passing through cascade transistors T601 and T602 may be reduced or substantially (if not completely) unchanged. Accordingly, by appropriately setting current source I401 of FIG. 4 to some minimum/predetermined current level, it may be possible to create a programmable amplifier where any or all of the switches SW501-1 . . . SW501-K of FIG. 5 may be manipulated without causing current flowing through cascade transistors T601 and T602 to drop below a predetermined level. This, in turn, will allow amplifier 124 to operate without substantially affecting its gain-bandwidth product and/or the available bandwidth such that the "knee" of the various gain levels remains constant.

Note that while FIG. 9 depicts current compensation circuits 350-1 and 350-2 that include a respective pair of current sources I901-1 . . . I901-K and I902-1 . . . I902-K for each gain circuit 330-1 . . . 330-K of FIG. 5, in view of the Bode diagram of FIG. 7 it may be advantageous in terms of hardware savings to include only enough pairs of current sources for a subset of gain circuits 350-1 . . . 350-K. For example, by using the constant gain circuit 330-0, seven gain circuits similar to those of FIG. 5 and three pairs of current compensation circuits I901-1/I902-1 . . . I901-3/I902-3, an amplifier having eight gain levels $G_0$-$G_7$ may be constructed without compromising the gain-bandwidth product.

Also note that while the current compensation circuits 350-1 and 350-2 of FIG. 9 and the gain and current circuits 330-L . . . 330-N and 340-L . . . 340-N circuits may be used independent of one another, it various embodiments it may be possible to use any combination of the power-saving gain circuitry of FIG. 5, the non-power-saving gain circuitry of FIG. 8 and the current compensation circuitry of FIG. 9 that may be found advantageous and/or useful. Such combinations may come with a caveat that optimal current savings may be had by assuring that the power-saving gain circuitry is the first turned off and the last to turned on, when possible. Another caveat is that cost of production may be lowered by using a minimum number current compensation circuits 350-1 and 350-2, when possible.

Figure 10:
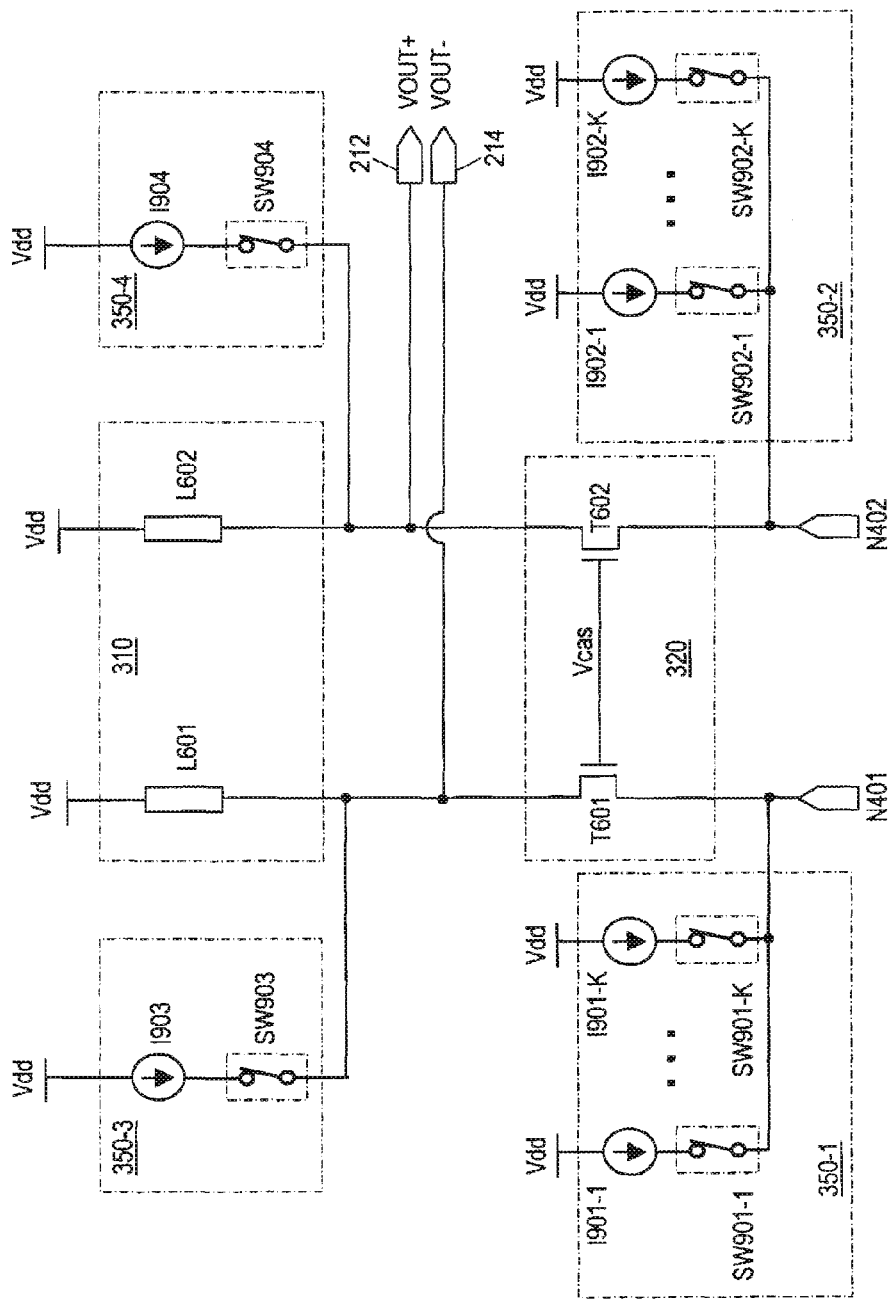
FIG. 10 is a schematic diagram of the load circuit and cascade circuit of FIG. 6 supplemented by another embodiment of various current compensation circuitry.

Continuing to FIG. 10, another embodiment of the circuitry of FIG. 9 is presented whereby current compensation circuits 350-1 and 350-2 are supplemented by a pair of second current compensation circuits 350-3 and 350-4. Note that while exemplary current compensation circuit 350-3 includes a single current source I903 in series with switch SW903, and exemplary current compensation circuit 350-4 also includes a single current source I904 in series with a respective switch SW904, any number of current sources and switches may be used as may be found advantageous, practical or necessary.

In operation, current compensation circuits 350-3 and 350-4 may be used to partially compensate for current changes caused by enabling or disabling gain circuits 330-1 . . . 330-K (of FIG. 5) by supplying current to the drains of transistors T601 and T602, while current compensation circuits 350-1 and 350-2 also partially compensate by providing current to nodes N401 and N402. For example, it may be possible for current compensation circuits 350-1 and 350-2 to supply 90% of the current drain required by current source I501-1 of FIG. 5 while current compensation circuits 350-3 and 350-4 provide the remaining 10%. Accordingly, current compensation circuits 350-3 and 350-4 may be used to subtly affect the current passing through cascade circuit 320. The resultant effects may include changes in gain and/or gain/bandwidth product for high gains.

Figure 11:
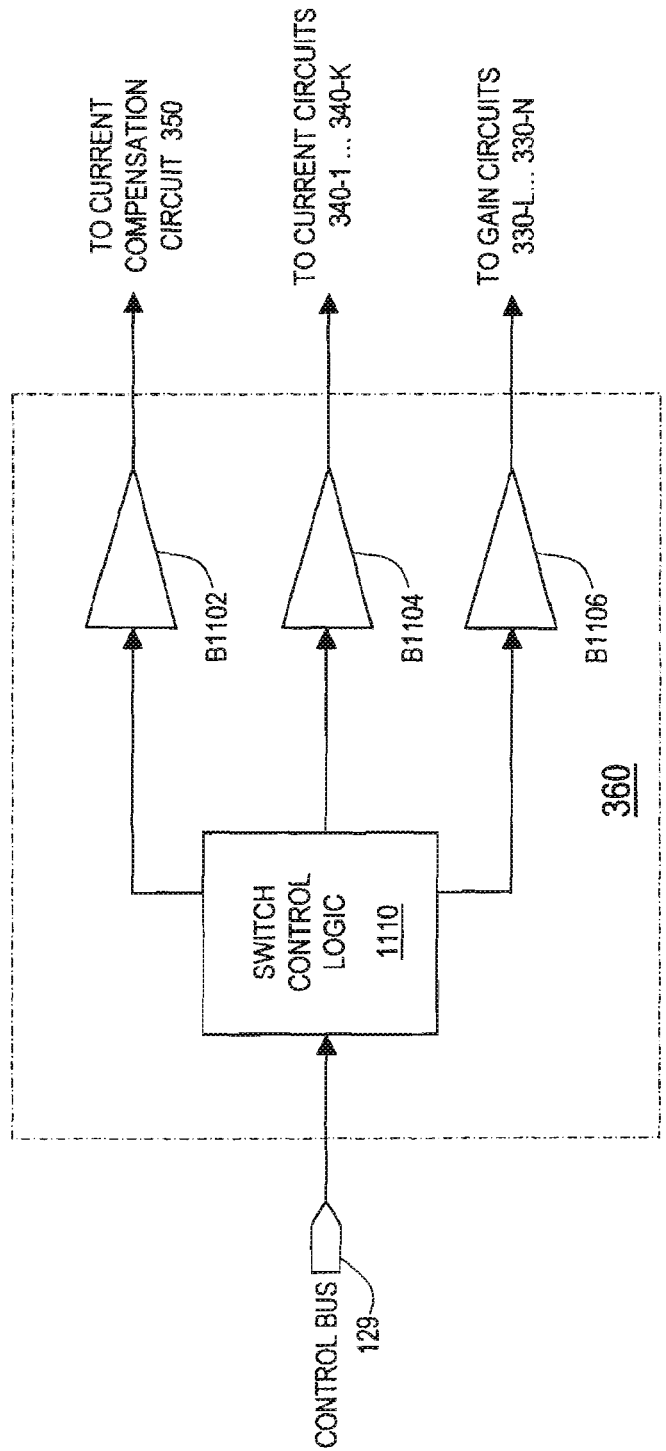
FIG. 11 is a schematic diagram of an exemplary control circuit for use in the first amplifying stage of FIG. 3.

FIG. 11 is a block diagram of control logic 360 depicted in FIG. 3. Control logic 360 includes switch control logic 1110 and buffers B1102, B1104 and B1106. In operation, control information received by control bus 129 may be received by switch control logic 1110. As discussed above, various control commands can include commands to increase or decrease gain without affecting the available gain-bandwidth product of amplifier 124, as well as gain control commands and/or current control commands that may affect the gain-bandwidth product and/or bandwidth of amplifier 124.

For instance, it may be desirable to decrease gain by 10 db while conserving current to an amount possible. In such an instance, switch control logic 1110 may send command signals to current compensation circuit 350, current circuits 340-1 . . . 340-K and/or gain circuits 330-L . . . 330-N according to any appropriate combination that under the present circumstances would cause a gain decrease of 10 db along with a commensurate current decrease. While it should be appreciated that such a decrease in gain might favor turning off switches SW501-1 . . . SW501-K, as discussed above with regard to FIG. 7, there may be limits to the number of such switches that might be turned off without appreciably affecting the gain-bandwidth product of amplifier 124. Accordingly, in such instances one or more of the gain circuits 330-L . . . 330-N of FIG. 8 may be switched off and/or the various current compensation circuits 350-1, 350-2, 350-3 and 350-4 depicted in FIGS. 9 and 10 may used. As switch control logic 1110 sends command signals to various receiving switches (not shown in FIG. 11), buffers B1102, B1104 and B1106 may be used to condition the command signals into a form better suited for analog switches and/or provide an appropriate buffering to the command signals for faster response.

Figure 12:
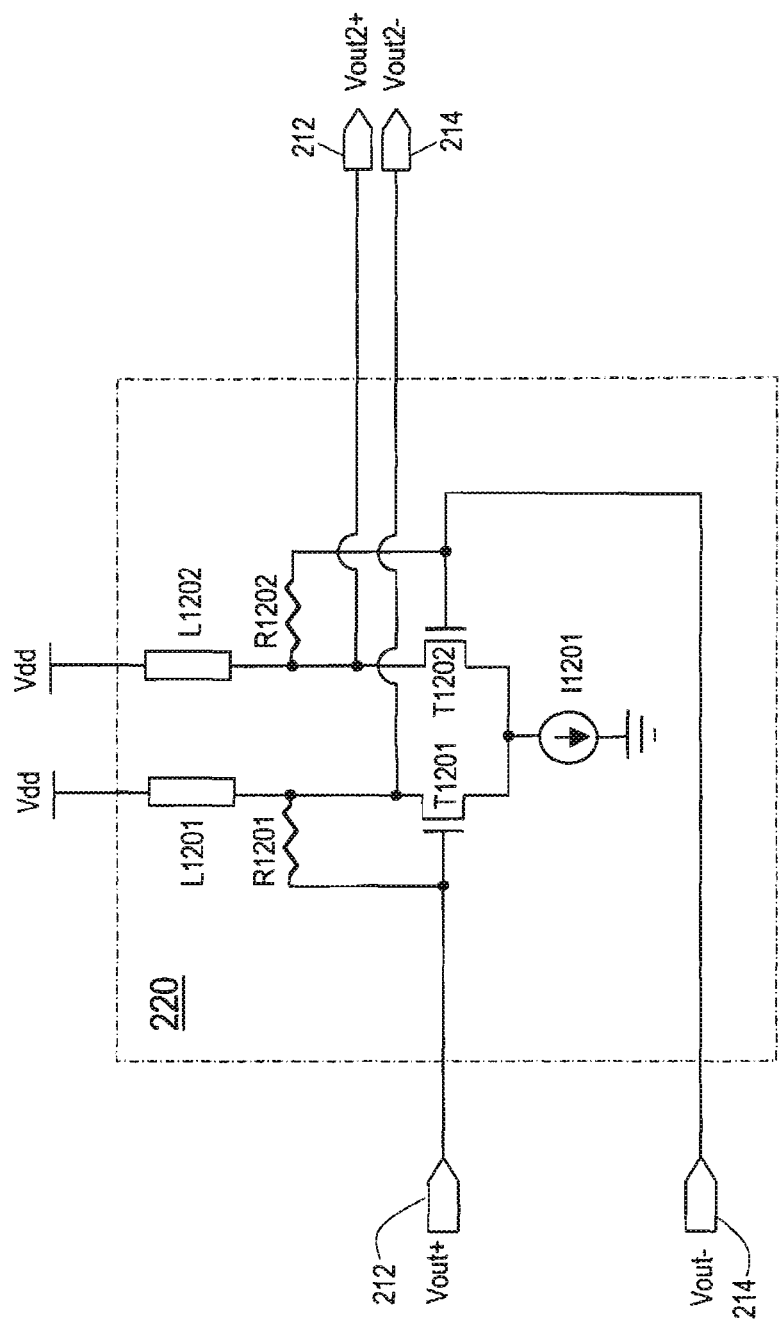
FIG. 12 is a schematic diagram of an exemplary second amplification stage of the amplifier depicted in FIG. 2.

Continuing to FIG. 12, a schematic of (optional) second amplifier stage 220 of FIG. 3 is depicted. As shown in FIG. 12, second amplifier stage 220 may include a differential transistor pair T1201 and T1202 with their sources commonly coupled to current source I1201, and their drains respectively connected to loads L1201 and L1202 and feedback resistors R1201 and R1202. In operation, transistors T1201 and T1202 may receive differential output signal (Vout+, Vout−) provided from nodes 212 and 214, amplify the differential signal and provide a further amplified signal (Vout2+, Vout2−) to output nodes 222 and 224. Note that while second amplifier stage 220 may not be necessary for many applications, it should be appreciated that second amplifier stage 220 may be used in many applications where additional gain is required, it is desirable to reduce or control the output loading on loads L1201 and L1202, a transconductance amplifier is desired (by removing loads L1201 and L1202) and so on.

Figure 13:
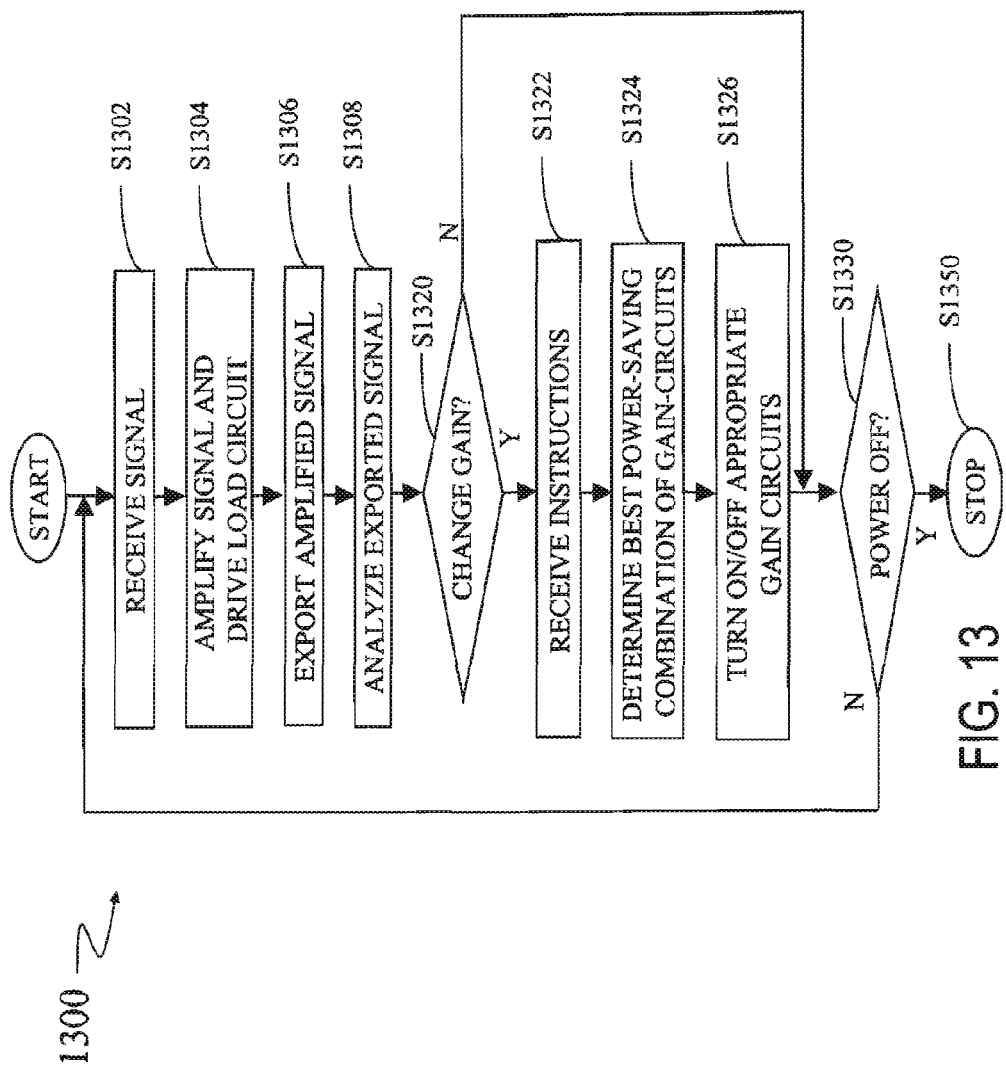
FIG. 13 is a flowchart outlining an exemplary process for operating an analog amplifier having the capacity to amplify electronic signals.

FIG. 13 is a flowchart 1300 outlining an exemplary process for operating a programmable amplifier, such as amplifier 124 discussed in the previous figures. The process starts in step S1302 where the programmable amplifier receives an analog signal, and the process goes to step S1304. In step S1304, the received analog signal may be separately amplified by any number of gain circuits, such as the constant gain circuit 330-0 depicted in FIG. 4 as well as by a number of switchable gain circuits, such as gain circuits 330-1 . . . 330-K depicted in FIG. 5 and/or gain circuit gain circuits 330-L . . . 330-N depicted in FIG. 8. As the various gain circuits 330-0 . . . 330-N separately amplify the received analog signal, the various amplified signals may be combined into a common current signal, and passed through a cascade circuit to drive a common load circuit where a differential voltage may be produced, and the process goes to step S1306. In step S1306, the amplified signal may be output to an external device, such as a controller, signal processor or other system that may be capable of analyzing the exported signal, and the process goes to step S1308.

In step S1308, the output signal may be analyzed to determine whether the output signal of the programmable amplifier exhibits the desired characteristics and/or determine whether the power level of the programmable amplifier may need to be changed, and the process goes to step S1320. In step S1320, a determination is made as to whether to reconfigure the programmable amplifier in order to change its gain and/or modify its current consumption with or without a change in the amplifier's gain-bandwidth product. If the programmable amplifier is to be reconfigured, the process goes to step S1322; otherwise, the process goes to step S1330.

In step S1322, the programmable amplifier may receive any number of instructions to make the appropriate changes in an existing gain and/or current consumption, and the process goes to step S1324. In step S1324, an appropriate combination of gain circuits and/or current compensation circuits, such as any of the circuitry discussed above with respect to FIGS. 5-10, in the programmable amplifier may be turned on or off consistent with the instructions of step S1322 to create a signal having a modified gain and/or a programmable amplifier having a modified current consumption, and the process goes to step S1330. In step S1330, a determination is made as to whether to turn the power of the subject amplifier off. If power is to be turned off, the process goes to step S1350 where the process stops; otherwise, the process returns to step S1302.

While the disclosed methods and systems have been described in conjunction with exemplary embodiments, these embodiments should be viewed as illustrative, not limiting. Various modifications, substitutes, or the like are possible within the spirit and scope of the disclosed methods and systems.

What is claimed is:

1. A programmable gain amplifier, comprising:
   a first gain circuit consuming a first power;
   a programmable gain circuit consuming a variable second power;
   a demodulator that is configured to demodulate a signal; and
   a controller that is coupled to the programmable gain circuit and the demodulator, the controller being configured to
   monitor the demodulated signal and control the programmable gain circuit to adjust at least one of a gain and a power consumption of the programmable gain circuit, based on a quality of the demodulated signal.

2. The amplifier of claim 1, further comprising:
   one or more second gain circuits included in the programmable gain circuit; and
   one or more current sources, the second gain circuits and the current sources being turned on and off based on a control data to change the gain of the programmable gain circuit.

3. The amplifier of claim 2, further comprising:
   a first current source associated with the first gain circuit; and
   one or more second current sources associated with the second gain circuits, the second current sources being controlled by the control data to change a gain of the second gain circuits.

4. The amplifier of claim 3, further comprising:
one or more switches included in the second current sources, the switches being controlled by the control data to turn on and off the second current sources.

5. The amplifier of claim 2, further comprising:
one or more switches included in the current sources, the switches being controlled by the control data to turn on and off the current sources.

6. The amplifier of claim 2, further comprising:
a cascade circuit; and
an upper node and a lower node of the cascade circuit, the lower node being connected to the first and second gain circuits.

7. The amplifier of claim 6, wherein:
a first portion of the current sources is connected to the upper node and a second portion of the current sources is connected to the lower node, the first and second portions of the current sources being turned on and off to control a performance of the cascade circuit.

8. The amplifier of claim 2, further comprising:
one or more third gain circuits; and
one or more third current sources connected to the third gain circuits, the third gain circuits being turned on or off based on the control data.

9. The amplifier of claim 8, further comprising:
one or more switches coupled to the third gain circuits, the switches turning the third gain circuits on and off based on the control data without affecting the third current sources.

10. The amplifier of claim 9, further comprising:
a cascade circuit; and
an upper node and a lower node of the cascade circuit, wherein the third gain circuits is connected to the lower node and at least a portion of the current sources is connected to the upper node, and the control data turns on and off the portion of current sources and the switches coupled to the third gain circuits to control a performance of the cascade circuit.

11. The amplifier of claim 1, further comprising:
one or more first transistors included in the first gain circuit;
one or more second transistors included in the programmable gain circuit forming one or more second gain circuits, wherein each of the first and second transistors includes a control terminal, a first power terminal and a second power terminal.

12. The amplifier of claim 11, wherein the first and second transistors are selected from one or more of:
MOSFET transistors having gates as control terminals and sources and drains as first and second power terminals, respectively; and
bipolar transistors having bases as control terminals and collectors and emitters as first and second power terminals, respectively.

13. The amplifier of claim 11, wherein:
the first transistors are connected as a first differential pair having corresponding second power terminals connected together to form a first lower node and each of corresponding first power terminals forming a pair of first upper nodes, the first lower node being connected to a first current source; and
the second transistors are connected as a plurality of second differential pairs having corresponding second power terminals connected together to form second lower nodes, and each of corresponding first power terminals forming pairs of second upper nodes, the second lower nodes being connected to corresponding second current sources, the first upper nodes being connected to corresponding ones of the second upper nodes connecting the first gain circuit in parallel with the second gain circuits.

14. The amplifier of claim 13, further comprising:
one or more programming circuits, a first portion of the programming circuits connected to the second current sources, the programming circuits being responsive to the control data to turn on and off the second current sources.

15. The amplifier of claim 14, wherein the programming circuits are switches connected in series with the second current sources, the switches turning off the second current sources when forming a substantially open circuit and turning on the second current sources when forming a substantially closed circuit.

16. The amplifier of claim 14, further comprising:
one or more current sources coupled to the first and second upper nodes of the first and second gain circuits, wherein a second portion of the programming circuits is connected to the current sources and is responsive to turn on and off the current sources based on the control data.

17. The amplifier of claim 16, wherein the programming circuits are switches connected in series with the current sources, the switches turning off the current sources when forming a substantially open circuit and turning on the current sources when forming a substantially closed circuit.

18. The amplifier of claim 17, further comprising:
a cascade circuit, the cascade circuit having an upper portion and a lower portion, the lower portion being connected to first and second upper nodes of the first and second gain circuits.

19. The amplifier of claim 18, further comprising two transistors forming the cascade circuit, first power terminals of the two transistors forming the upper portion and second power terminals forming the lower portion, gates of the two transistors being connected together and coupled to a biasing circuit.

20. The amplifier of claim 18, wherein:
the current sources include a first portion and a second portion, the first portions connected to the upper portion of the cascade circuit and the second portion connected to the lower portion of the cascade circuit, the control data turning on and off the first and second portions of the current sources to maintain a performance of the cascade circuit.

21. The amplifier of claim 14, further comprising:
one or more third transistors forming third gain circuits, the third transistors connected into differential pairs having third upper nodes formed by first power terminals of the third transistors and third lower nodes formed by second power terminals of the third transistors; and
one or more third current sources, the third upper nodes of the third gain circuits being connected to the first and second upper nodes of the first and second gain circuits and the third lower nodes being connected to corresponding ones of the third current sources.

22. The amplifier of claim 21, further comprising:
a third portion of the programming circuits connected across the first and second power terminal of the third transistors, the third portion of the programming circuits turning off a corresponding third gain circuit by forming substantially a zero resistance path shunting third transistor of the corresponding gain circuit, and turning on the corresponding third gain circuit by forming substantially an open circuit.

23. A programmable gain amplifier, comprising:
a first gain circuit that includes one or more first transistors, the first transistors being connected to form a first differential pair that includes first power terminals forming a pair of first upper nodes and second power terminals connected together to form a first lower node, the first lower node being connected to a first current source;
one or more second gain circuits that include one or more second transistors, the second transistors being connected as a plurality of second differential pairs that include first power terminals forming pairs of second upper nodes and second power terminals connected together to form second lower nodes, the second lower nodes being connected to corresponding second current sources, the first gain circuit being connected in parallel with the second gain circuits by connecting the first upper nodes to corresponding ones of the second upper nodes;
a cascade circuit, the cascade circuit that includes two transistors, first power terminals of the two transistors forming an upper portion and second power terminals forming a lower portion, gates of the two transistors being connected together and coupled to a biasing circuit, the lower portion being connected to the first and second upper nodes of the first and second gain circuits;
one or more current sources coupled to the first and second upper nodes of the first and second gain circuits, the current sources include a first portion and a second portion, the first portions connected to the upper portion of the cascade circuit and the second portion connected to the lower portion of the cascade circuit;
one or more programming circuits, a first portion of the programming circuits being connected to the second current sources, a second portion of the programming circuits being connected to the current sources, and the programming circuits being responsive to a control data to turn on and off the second current sources and the current sources; and
the control data that controls the programming circuits to change a gain and a corresponding power consumption of the programmable gain amplifier.

24. The amplifier of claim 23, wherein the programming circuits are switches connected in series with the second current sources, the switches turning off the second current sources by forming a substantially open circuit and turning on the second current sources by forming a substantially closed circuit.

25. The amplifier of claim 23, wherein the programming circuits are switches connected in series with the current sources, the switches turning off the current sources by forming a substantially open circuit and turning on the current sources by forming a substantially closed circuit.

26. A communication apparatus incorporating the programmable gaining amplifier of claim 23.

27. A data storage system incorporating the programmable gaining amplifier of claim 23.

28. A method for programmably amplifying an electrical signal, comprising:
first amplifying the electrical signal to generate a first amplified signal consuming a first power;
second amplifying the first amplified signal by an amplified amount to generate a second amplified signal and consuming a second power, a magnitude of the second power varying based on a specified value of the amplified amount;
demodulating the second amplified signal; and
adjusting at least one of the amplified amount of the second amplified signal and the second power consumption based on a quality of the demodulated second signal.

29. The method of claim 28, further comprising:
conducting first currents for generating the first amplified signal;
conducting one or more second currents for generating the second amplified signal; and
summing the first and second currents into a sum current for outputting an output signal that corresponds to the electrical signal amplified by a sum amplified amount.

30. The method of claim 29, further comprising:
specifying the amplified amount based on a control data; and
controlling a number of the second currents to be summed with the first current, the number corresponding to the specified amplified amount.

31. The method of claim 29, further comprising:
conducting a first portion of the sum current through a cascade circuit;
conducting a second portion of the sum current bypassing the cascade circuit; and
balancing the first and second portions of the sum current to maintain performance of the cascade circuit.

32. The method of claim 31, further comprising:
controlling the balancing by specifying a first current value of the first portion of the sum current and a second current value of the second portion of the sum current based on the specified value of the amplified amount.

33. The method of claim 29, further comprising:
specifying a predetermined value of second currents that is always a part of the sum current.

34. A method for forming a programmable amplifier, comprising:
connecting one or more first transistors with a first current source to form a first gain circuit;
connecting one or more second transistors with one or more second current sources to form a second gain circuit;
demodulating a signal from the second gain circuit to create a demodulated signal;
monitoring the demodulated signal to determine a quality of the demodulated signal; and
adjusting the second gain circuit to change at least one of a gain and a power consumption of the second gain circuit based on the quality of the demodulated signal.

35. The method of claim 34, further comprising:
connecting a first portion of one or more programming circuits to the second current sources; and
providing a first control interface for controlling the first portion of the programming circuits to turn on and off the second current sources.

36. The method of claim 35, further comprising:
connecting the first and second gain circuits in parallel to form one or more gain circuit output nodes;
connecting a plurality of current sources to the gain circuit output nodes;
connecting a second portion of the programming circuits to the current sources; and
providing a second control interface for controlling the second portion of the programming circuits to turn on and off the current sources.

37. The method of claim 36, further comprising:
connecting a cascade circuit to the gain circuit output nodes; and connecting a first portion of the current sources to one or more cascade circuit output nodes;

connecting a second portion of the current sources to the cascade circuit output nodes; and providing a third control interface for balancing a first number of the first portion of the current sources and a second number of the second portion of the current sources to maintain a performance of the cascade circuit.

38. The method of claim 36, further comprising:

coupling one or more loads to the gain circuit output nodes; and providing an output interface for outputting an amplified electrical signal from one or more nodes of the load.

39. The method of claim 36, further comprising:

connecting a further amplifier to the load; and providing an output interface of the further amplifier for outputting an output of the further amplifier.

40. The method of claim 35, further comprising:

connecting one or more third transistors to form one or more third gain circuits;

connecting third current sources to the third gain circuits; and connecting a third portion of the programming circuits to the third gain circuits for turning on and off the third gain circuits without affecting the third current sources.

41. A programmable gain amplifier, comprising:

first gain means for generating a first gain;

second gain means for generating a second gain;

demodulating means for generating a demodulated signal; and programming means that is coupled to second gains means and the demodulating means, for controlling the second gain means to adjust at least one of a gain and power consumption of the second gains means, based on a quality of the demodulated signal.

42. The amplifier of claim 41, further comprising:

first current means for providing current to the first gain means; and second current means for providing current to the second gain means, the programming means turning one and off components of the second current means based on a control data.

43. The amplifier of claim 42, further comprising:

current means for supplying current to the first and second gain means, the programming means controlling the current means based on the control data.

44. The amplifier of claim 43, further comprising:

cascade means for decoupling the first and second gain circuits from a load and for providing additional gain, the cascade means having one or more upper nodes and one or more lower nodes, the current means providing one or more first currents to the upper nodes and one or more second currents to the lower nodes.

45. The amplifier of claim 42, further comprising:

third gain means for providing one or more third gains; and third current means for providing one or more third currents to the third gain means, the programming means turning on and off portions of the third gain means without affecting the third current means.

* * * * *